United States Patent
Fan et al.

(10) Patent No.: US 10,290,776 B1
(45) Date of Patent: May 14, 2019

(54) WHITE LIGHT EMITTING DIODE, MANUFACTURING METHOD AND APPLICATION THEREOF

(71) Applicant: HUIZHOU CHINA STAR OPTOELECTRONICS TECHNOLOGY CO.,LTD., Huizhou, Guangdong (CN)

(72) Inventors: Yong Fan, Guangdong (CN); Guofeng Kuang, Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 0 days.

(21) Appl. No.: 15/980,007

(22) Filed: May 15, 2018

Related U.S. Application Data

(63) Continuation of application No. PCT/CN2018/074003, filed on Jan. 24, 2018.

(30) Foreign Application Priority Data

Jan. 16, 2018 (CN) .......................... 2018 1 0041067

(51) Int. Cl.
*H01L 33/50* (2010.01)
*H01L 33/56* (2010.01)

(52) U.S. Cl.
CPC ............ *H01L 33/504* (2013.01); *H01L 33/56* (2013.01); *H01L 2933/005* (2013.01); *H01L 2933/0041* (2013.01)

(58) Field of Classification Search
CPC . H01L 33/504; H01L 33/56; H01L 2933/005; H01L 2933/0041
See application file for complete search history.

(56) References Cited

U.S. PATENT DOCUMENTS

2014/0203287 A1    7/2014   Zhang et al.

FOREIGN PATENT DOCUMENTS

| CN | 105810674 A | 7/2016 |
| CN | 107134221 A | 9/2017 |
| CN | 107302017 A | 10/2017 |

OTHER PUBLICATIONS

Li, Shuxing et al., Review—Narrow-Band Nitride Phosphors for Wide Color-Gamut White LED Backlighting; ECS Journal of Solid State Science and Technology, 7(1) R3064-R3078, Published 2018 (Year: 2018).*

* cited by examiner

*Primary Examiner* — John P. Dulka
(74) *Attorney, Agent, or Firm* — Hauptman Ham, LLP

(57) ABSTRACT

Provided is a white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises $\gamma$-AlON:$Mn^{2+}$, $Mg^{2+}$ green phosphor powder. The color gamut of white light emitting diode obtained by using $\gamma$-AlON:$Mn^{2+}$, $Mg^{2+}$ green phosphor powder with high color gamut, narrow half width, and slow luminance decay can reach BT.2020 80% or more, which is equivalent to the use of green quantum dots. It meets the requirements of high color gamut while reducing the use of green quantum dot materials. The reliability of white light emitting diode is improved to reduce production costs and achieve environmental protection.

20 Claims, 4 Drawing Sheets

WHITE LIGHT EMITTING DIODE, MANUFACTURING METHOD AND APPLICATION THEREOF

CROSS-REFERENCE TO RELATED APPLICATION

This application is a continuing application of PCT Patent Application No. PCT/CN2018/074003 entitled 'White light emitting diode, manufacturing method and application thereof', filed on Jan. 24, 2018, which claims priority to Chinese Patent Application No. 201810041067.8, filed on Jan. 16, 2018, both of which are hereby incorporated in its entireties by reference.

FIELD OF THE INVENTION

The present invention relates to a display field, and more particularly to a white light emitting diode, a manufacturing method and an application thereof.

BACKGROUND OF THE INVENTION

Currently, most commercially liquid crystal displays in the market are backlight type liquid crystal display devices. White light LEDs (Light Emitting Diodes) are generally used as backlight sources. The most common white LED is a blue light emitting die with a yellow yttrium aluminum garnet phosphor powder. In case that the LED with a yellow phosphor material is used with a liquid crystal panel, the color saturation is low. The display color gamut is generally about 72% NTSC (National Television System Committee) and the display color is not bright enough. In order to improve the color saturation, the yellow phosphor powder can be changed to a red green (RG) phosphor powder. However, this method can only increase the color gamut by up to about 25% and fails to meet the new BT.2020 color gamut standard (equivalent to 134% NTSC).

At present, what can realize 80% of the BT.2020 color gamut standards is the quantum dot technology, i.e. the LED having a blue light emitting die plus green quantum dots and red quantum dots. However, the thermal stability and blue light stability of the quantum dots are poor and can easily react with water and oxygen after light exposure to cause the defects occur, resulting in reduced efficiency of the material excitation or even failure and seriously affecting the service life of the LED. Meanwhile, the quantum dot material is expensive and is mostly composed of heavy metal-containing substances. The use of large amount of the quantum dots can cause environmental pollution and increase the cost. Therefore, there is an urgent need for a highly reliable, high color gamut and low-cost light emitting diode.

SUMMARY OF THE INVENTION

On this account, the present invention provides a white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises $\gamma$-AlON:Mn$^{2+}$, Mg$^{2+}$ green phosphor powder. The color gamut of white light emitting diode using $\gamma$-AlON:Mn$^{2+}$, Mg$^{2+}$ green powder with high color gamut, narrow half width, and slow luminance decay can reach BT.2020 80% or more, which is equivalent to the use of green quantum dots. It meets the requirements of high color gamut while reducing the use of quantum dot materials. The reliability of white light emitting diode is improved to reduce production costs and achieve environmental protection.

First, the present invention provides a white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises $\gamma$-AlON:Mn$^{2+}$, Mg$^{2+}$ green phosphor powder.

The $\gamma$-AlON:Mn$^{2+}$, Mg$^{2+}$ green phosphor powder is $\gamma$-AlON green phosphor powder doped with magnesium ion and manganese ion.

Optionally, the light emitting layer is a single layer structure. A material of the light emitting layer comprises green phosphor powder, red quantum dots and a disperse medium. The light emitting layer is a single layer structure, in which the green phosphor powder, the red quantum dots and the disperse medium are mixed together. Optionally, a molar ratio of the green phosphor powder, the red quantum dots and the disperse medium in the light emitting layer is (1.5-3):(0.001-0.02):1, and a thickness of the light emitting layer is from 50 μm to 400 μm. Furthermore and optionally, a molar ratio of the green phosphor powder, the red quantum dots and the disperse medium in the light emitting layer is (1.8-2.5):(0.008-0.015):1, and a thickness of the light emitting layer is from 100 μm to 350 μm, from 130 μm to 320 μm or from 160 μm to 280 μm.

Optionally, the light emitting layer is a two layer structure, and the light emitting layer comprises a green phosphor powder layer and a red quantum dots layer. A material of the green phosphor powder layer comprises green phosphor powder and a disperse medium. Optionally, a molar ratio of the green phosphor powder and the dispersion medium in the green phosphor powder layer is (1.5-3):1. Furthermore and optionally, a molar ratio of the green phosphor powder and the dispersion medium in the green phosphor powder layer is (1.8-2.5):1. Optionally, a thickness of the green phosphor powder layer is 50 μm to 200 μm. Furthermore and optionally, a thickness of the green phosphor powder layer is from 80 μm to 180 μm, from 100 μm to 170 μm or from 130 μm to 160 μm. A material of the red quantum dots layer comprises red quantum dots and a disperse medium. Optionally, a molar ratio of the red quantum dots and the dispersion medium in the red quantum dots layer is (0.001-0.02):1. Furthermore and optionally, a molar ratio of the red quantum dots and the dispersion medium in the red quantum dots layer is (0.008-0.015):1. Optionally, a thickness of the red quantum dots layer is from 50 μm to 200 μm. Furthermore and optionally, a thickness of the red quantum dots layer is from 70 μm to 170 μm, from 90 μm to 160 μm or from 100 μm to 130 μm.

Optionally, the green phosphor powder has a particle size of 15 μm to 35 μm. Furthermore and optionally, the green phosphor powder has a particle size of 18 μm to 30 μm, 22 μm to 27 μm or 23 μm to 26 μm.

Optionally, the red quantum dot has a particle size of 5 nm to 10 nm. Furthermore and optionally, the red quantum dot has a particle size of 6 nm to 9 nm, 7.2 nm or 8.3 nm.

Optionally, the red quantum dots comprise at least one of CdSe/ZnS, CdSe/ZnSe, CdSe/CdS, InP/InPOx/ZnS, InP/ZnS, InP/ZnSe, CH$_3$CN$_2$PbI$_3$, CsPbI$_3$, CuInS, CuZnInS, MoS$_2$ quantum dots and graphene quantum dots. Furthermore and optionally, the red quantum dots comprise at least one of CdSe/ZnS, CdSe/ZnSe, InP/InPOx/ZnS, CuInS quantum dots and graphene quantum dots.

Optionally, the dispersion medium comprises at least one of organic silica gel, inorganic silica gel and epoxy resin. Furthermore and optionally, the dispersion medium is organic silica gel, a mixture of organic silica gel and inorganic silica gel or epoxy resin.

Optionally, the substrate comprises a ceramic substrate or a metal substrate. Optionally, a material of the ceramic substrate comprises at least one of AlN, $Al_2O_3$, SiO, $SiO_2$, $Si_3N_4$ and SiON. Optionally, a material of the metal substrate comprises at least one of potassium, sodium, calcium, magnesium and aluminum. Optionally, a thickness of the substrate is from 400 μm to 600 μm.

Optionally, the blue light die is a flip chip structure or a non-flip chip structure. Furthermore and optionally, the blue light die is a flip chip structure.

Optionally, a material of the inorganic protective layer comprises at least one of SiO, $SiO_2$, AlN, SiAlN and $Al_2O_3$, and a thickness of the inorganic protective layer is from 20 nm to 200 nm. The inorganic protective layer and the substrate form an enclosed space for blocking the corrosion of the external water and oxygen.

Second, the present invention provides a manufacturing method of the white light emitting diode provided as aforementioned, comprises steps of:

providing a substrate, and disposing a blue light die on the substrate with a die bonding process;

disposing a light emitting layer on the blue light die by a spin coating, dispensing or lamination process, wherein a material of the light emitting layer comprises green phosphor powder, red quantum dots and a disperse medium, and the green phosphor powder comprises γ-AlON:$Mn^{2+}$, $Mg^{2+}$ green phosphor powder;

depositing an inorganic protective layer on the light emitting layer by vapor deposition to obtain a white light emitting diode.

The inorganic protective layer is deposited on the surface of the light emitting layer and covers the surfaces of the substrate on both sides of the light emitting layer. The inorganic protective layer and the substrate form an enclosed space for blocking the corrosion of the external water and oxygen.

Third, the present invention provides a backlight module, comprising a white light emitting diode as aforementioned.

The benefits of the present invention are:

In the white light emitting diode provided by the present invention, a material of the light emitting layer comprises green phosphor powder, red quantum dots and a disperse medium, and the green phosphor powder comprises γ-AlON:$Mn^{2+}$, $Mg^{2+}$ green phosphor powder. The color gamut of white light emitting diode using γ-AlON:$Mn^{2+}$, $Mg^{2+}$ green phosphor powder with high color gamut, narrow half width, and slow luminance decay can reach BT.2020 80% or more, which is equivalent to the use of green quantum dots. It meets the requirements of high color gamut while reducing the use of quantum dot materials. The reliability of white light emitting diode is improved to reduce production costs and achieve environmental protection.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
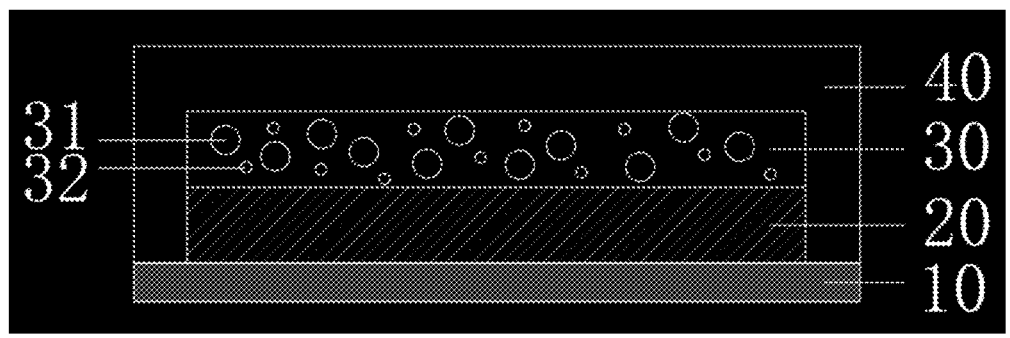
FIG. 1 is a structural diagram of a first white light LED according to the embodiment of the present invention.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

The present invention provides a white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises γ-AlON:$Mn^2$, $Mg^{2+}$ green phosphor powder.

In the embodiment of the present invention, the γ-AlON:$Mn^{2+}$, $Mg^{2+}$ green phosphor powder is γ-AlON green phosphor powder doped with magnesium ion and manganese ion.

In the embodiment of the present invention, the substrate comprises a ceramic substrate or a metal substrate. In the embodiment of the present invention, a material of the ceramic substrate comprises at least one of AlN, $Al_2O_3$, SiO, $SiO_2$, $Si_3N_4$ and SiON. In the embodiment of the present invention, a material of the metal substrate comprises at least one of potassium, sodium, calcium, magnesium and aluminum. In the embodiment of the present invention, a thickness of the substrate is from 400 μm to 600 μm.

In the embodiment of the present invention, the blue light die is a flip chip structure or a non-flip chip structure. Optionally, the blue light die is a flip chip structure. The blue light die of the flip chip structure has a shorter heat flow path than the non-flip chip structure and has a lower thermal resistance, which is more conducive to heat dissipation.

In the embodiment of the present invention, a material of the inorganic protective layer comprises at least one of SiO, $SiO_2$, AlN, SiAlN and $Al_2O_3$. In the embodiment of the present invention, a thickness of the inorganic protective layer is from 20 nm to 200 nm.

In the embodiment of the present invention, the green phosphor powder has a particle size of 15 μm to 35 μm. Optionally, the green phosphor powder has a particle size of 18 μm to 30 μm, 22 μm to 27 μm or 23 μm to 26 μm. In the embodiment of the present invention, the red quantum dot has a particle size of 5 nm to 10 nm. In the embodiment of the present invention, the red quantum dot has a particle size of 6 nm to 9 nm, 7.2 nm or 8.3 nm. In the embodiment of the present invention, the red quantum dots comprise at least one of CdSe/ZnS, CdSe/ZnSe, CdSe/CdS, InP/InPOx/ZnS, InP/ZnS, InP/ZnSe, $CH_3CN_2PbI_3$, $CsPbI_3$, CuInS, CuZnInS, $MoS_2$ quantum dots and graphene quantum dots. Optionally, the red quantum dots comprise at least one of CdSe/ZnS, CdSe/ZnSe, InP/InPOx/ZnS, CuInS quantum dots and graphene quantum dots.

In the embodiment of the present invention, the dispersion medium comprises at least one of organic silica gel, inorganic silica gel and epoxy resin. Optionally, the dispersion medium is organic silica gel, a mixture of organic silica gel and inorganic silica gel or epoxy resin.

In the embodiment of the present invention, the light emitting layer is a single layer structure or a two layer structure.

Please refer to FIG. 1, which is a structural diagram of a first white light LED according to the embodiment of the present invention. The white light LED comprises a substrate 10, a blue light die 20, a light emitting layer 30 and an inorganic protective layer 40. The light emitting layer 30 is a single layer structure. A material of the light emitting layer 30 comprises the green phosphor powder 31, the red quantum dots 32 and the disperse medium. The light emitting layer 30 is a single layer structure, in which the green phosphor powder 31, the red quantum dots 32 and the disperse medium are mixed together. The green phosphor powder 31 and the red quantum dots 32 are uniformly dispersed in the light emitting layer 30. In the embodiment of the present invention, a molar ratio of the green phosphor powder 31, the red quantum dots 32 and the disperse medium in the light emitting layer 30 is (1.5-3):(0.001-0.02):1, and a thickness of the light emitting layer 30 is from 50 μm to 400 μm. Optionally, a molar ratio of the green phosphor powder 31, the red quantum dots 32 and the disperse medium in the light emitting layer 30 is (1.8-2.5):(0.008-0.015):1, and a thickness of the light emitting layer 30 is from 100 μm to 350 μm, from 130 μm to 320 μm or from 160 μm to 280 μm.

Figure 2:
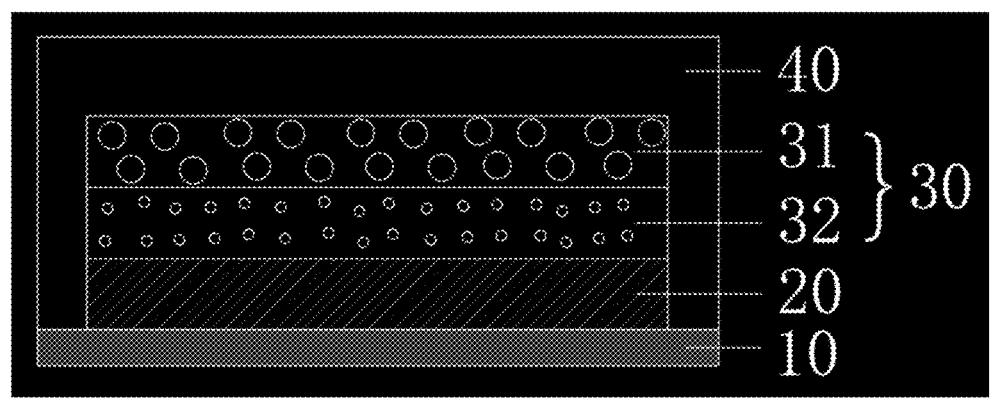
FIG. 2 is a structural diagram of a second white light LED according to the embodiment of the present invention.
Figure 3:
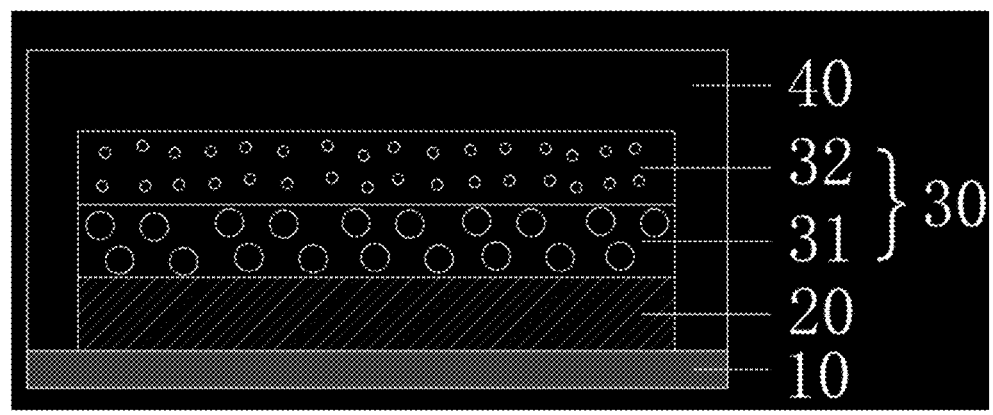
FIG. 3 is a structural diagram of a third white light LED according to the embodiment of the present invention.

Please refer to FIG. 2 and FIG. 3, which show structural diagrams of the second white LED and the third white LED according to the embodiment of the present invention. Either of the white LEDs comprises a substrate 10, a blue light die 20, a light emitting layer 30 and an inorganic protective layer 40. The light emitting layer 30 is a two layer structure, and comprises a green phosphor powder layer 31 and a red quantum dots layer 32. The order of the green phosphor powder layer 31 and the red quantum dots layer 32 is not limited. Optionally, as shown in FIG. 2, the red quantum dots layer 32 is deposited on the blue light die 20, and the green phosphor powder layer 31 is deposited on the red quantum dots layer 32. Optionally, as shown in FIG. 3, the green phosphor powder layer 31 is deposited on the blue light die 20, and the red quantum dots layer 32 is deposited on the green phosphor powder layer 31. In the embodiment of the present invention, a material of the green phosphor powder layer 31 comprises green phosphor powder and a dispersion medium. Optionally, a molar ratio of the green phosphor powder and the dispersion medium in the green phosphor powder layer 31 is (1.5-3):1. Furthermore and optionally, a molar ratio of the green phosphor powder and the dispersion medium in the green phosphor powder layer 31 is (1.8-2.5):1. In the embodiment of the present invention, a thickness of the green phosphor powder layer 31 is 50 μm to 200 μm. Optionally, a thickness of the green phosphor powder layer 31 is from 80 μm to 180 μm, from 100 μm to 170 μm or from 130 μm to 160 μm. In the embodiment of the present invention, a material of the red quantum dots layer 32 comprises red quantum dots and a dispersion medium. Optionally, a molar ratio of the red quantum dots and the dispersion medium in the red quantum dots layer 32 is (0.001-0.02):1. Furthermore and optionally, a molar ratio of the red quantum dots and the dispersion medium in the red quantum dots layer 32 is (0.008-0.015):1. In the embodiment of the present invention, a thickness of the red quantum dots layer 32 is from 50 μm to 200 μm. Furthermore and optionally, a thickness of the red quantum dots layer 32 is from 70 μm to 170 μm, from 90 μm to 160 μm or from 100 μm to 130 μm.

The present invention provides a white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises $\gamma$-AlON:$Mn^{2+}$, $Mg^{2+}$ green phosphor powder. Compared with green phosphor powder $\beta$-SiAlON, $\gamma$-AlON:$Mn^{2+}$, $Mg^{2+}$ green phosphor powder possesses properties of high color gamut, narrow half width, and slow luminance decay. Meanwhile, the color gamut of white light emitting diode made thereby can reach BT.2020 80% or more, which is equivalent to the use of green quantum dots and can meet the requirements of high color gamut; the quantum dot materials are expensive, and are mostly composed of heavy metal-containing substances. A usage of large amount can cause environmental pollution and increase costs. Therefore, the use of the $\gamma$-AlON:$Mn^{2+}$, $Mg^{2+}$ green phosphor powder reduces the use of quantum dot materials to reduce production costs and achieve environmental protection. The white light emitting diode has a good heat dissipation effect and the barrier water oxygen effect and the reliability of the white LED are high.

Figure 4:
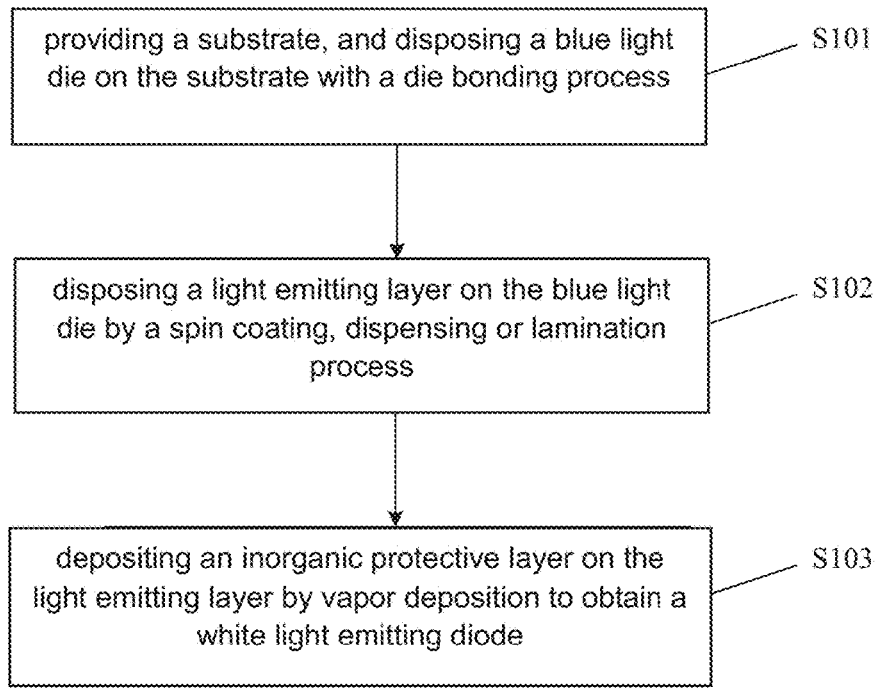
FIG. 4 is a flowchart of a manufacturing method of a white light LED according to the embodiment of the present invention.

Please refer to FIG. 4, which shows a manufacturing method of a white light LED according to the embodiment of the present invention. The manufacturing method comprises:

Step S101, providing a substrate, and disposing a blue light die on the substrate with a die bonding process.

Figure 5:
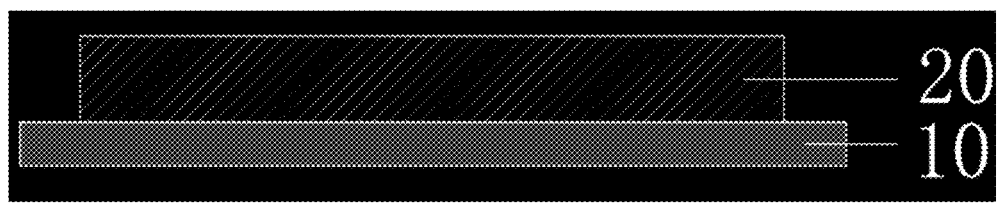
FIG. 5 is a diagram of Step S101 in a manufacturing method of a white light LED according to the embodiment of the present invention.

In Step S101, as show in FIG. 5, providing a substrate 10 is provided, and a blue light die 20 is disposed on the substrate 10 with a die bonding process. The substrate 10 is composed of a material having a water and oxygen barrier effect. Optionally, the substrate 10 comprises a ceramic substrate or a metal substrate. A material of the ceramic substrate comprises at least one of AlN, $Al_2O_3$, SiO, $SiO_2$, $Si_3N_4$ and SiON, and a material of the metal substrate comprises at least one of potassium, sodium, calcium, magnesium and aluminum, and a thickness of the substrate 10 is from 400 μm to 600 μm. The blue light die 20 is a flip chip structure or a non-flip chip structure. Optionally, the blue light die 20 is a flip chip structure. The blue light die of the flip chip structure has a shorter heat flow path than the non-flip chip structure and has a lower thermal resistance, which is more conducive to heat dissipation.

Step S102, disposing a light emitting layer on the blue light die by a spin coating, dispensing or lamination process.

Figure 6:
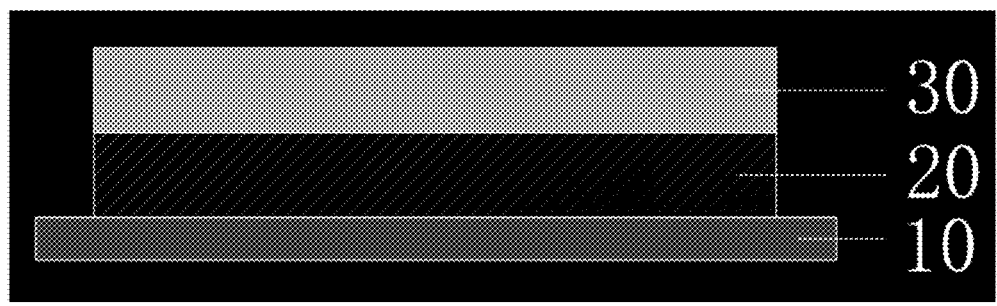
FIG. 6 is a diagram of Step S102 in a manufacturing method of a white light LED according to the embodiment of the present invention.

In Step S102, as shown in FIG. 6, a light emitting layer 30 is disposed on the blue light die 20 by a spin coating, dispensing or lamination process. A material of the light emitting layer comprises green phosphor powder, red quantum dots and a disperse medium, and the green phosphor powder comprises $\gamma$-AlON:$Mn^{2+}$, $Mg^{2+}$ green phosphor powder. Optionally, the green phosphor powder has a particle size of 15 μm to 35 μm. Furthermore and optionally, the green phosphor powder has a particle size of 18 μm to 30 μm, 22 μm to 27 μm or 23 μm to 26 μm. Optionally, the red quantum dots comprise at least one of CdSe/ZnS, CdSe/ZnSe, CdSe/CdS, InP/InPOx/ZnS, InP/ZnS, InP/ZnSe, $CH_3CN_2PbI_3$, $CsPbI_3$, CuInS, CuZnInS, $MoS_2$ quantum dots and graphene quantum dots. Furthermore and optionally, the red quantum dots comprise at least one of CdSe/ZnS, CdSe/ZnSe, InP/InPOx/ZnS, CuInS quantum dots and graphene quantum dots. Optionally, the dispersion medium comprises at least one of organic silica gel, inorganic silica gel and epoxy resin. Furthermore and optionally, the dispersion medium is organic silica gel, a mixture of organic silica gel and inorganic silica gel or epoxy resin. Optionally, the light emitting layer 30 is a single layer structure or a two layer structure. The green phosphor powder and the red quantum dots are uniformly distributed in the dispersion medium.

In one embodiment of the present invention, the light emitting layer 30 is a single layer structure. A material of the light emitting layer 30 comprises the green phosphor powder, the red quantum dots and the disperse medium. The light emitting layer is a single layer structure, in which the green phosphor powder, the red quantum dots and the disperse medium are mixed together. Optionally, a molar ratio of the green phosphor powder, the red quantum dots and the disperse medium in the light emitting layer 30 is (1.5-3):(0.001-0.02):1, and a thickness of the light emitting layer 30 is from 50 μm to 400 μm. Furthermore and optionally, a molar ratio of the green phosphor powder, the red quantum dots and the disperse medium in the light emitting layer 30 is (1.8-2.5):(0.008-0.015):1, and a thickness of the light emitting layer 30 is from 100 μm to 350 μm, from 130 μm to 320 μm or from 160 μm to 280 μm.

In another embodiment of the present invention, the light emitting layer 30 is a two layer structure, and the light emitting layer comprises a green phosphor powder layer and a red quantum dots layer. Optionally, a material of the green phosphor powder layer comprises green phosphor powder and a disperse medium. Optionally, a molar ratio of the green phosphor powder and the dispersion medium in the green phosphor powder layer is (1.5-3):1. Furthermore and optionally, a molar ratio of the green phosphor powder and the dispersion medium in the green phosphor powder layer is (1.8-2.5):1. Optionally, a thickness of the green phosphor powder layer is 50 μm to 200 μm. Furthermore and optionally, a thickness of the green phosphor powder layer is from 80 μm to 180 μm, from 100 μm to 170 μm or from 130 μm to 160 μm. Optionally, a material of the red quantum dots layer comprises red quantum dots and a disperse medium. Optionally, a molar ratio of the red quantum dots and the dispersion medium in the red quantum dots layer is (0.001-0.02):1. Furthermore and optionally, a molar ratio of the red quantum dots and the dispersion medium in the red quantum dots layer is (0.008-0.015):1. Optionally, a thickness of the red quantum dots layer is from 50 μm to 200 μm. Furthermore and optionally, a thickness of the red quantum dots layer is from 70 μm to 170 μm, from 90 μm to 160 μm or from 100 μm to 130 μm. The red quantum dots can be uniformly distributed in the dispersion medium, which reduces the agglomeration of the quantum dot material.

Step S103, depositing an inorganic protective layer on the light emitting layer by vapor deposition to obtain a white light emitting diode.

Figure 7:
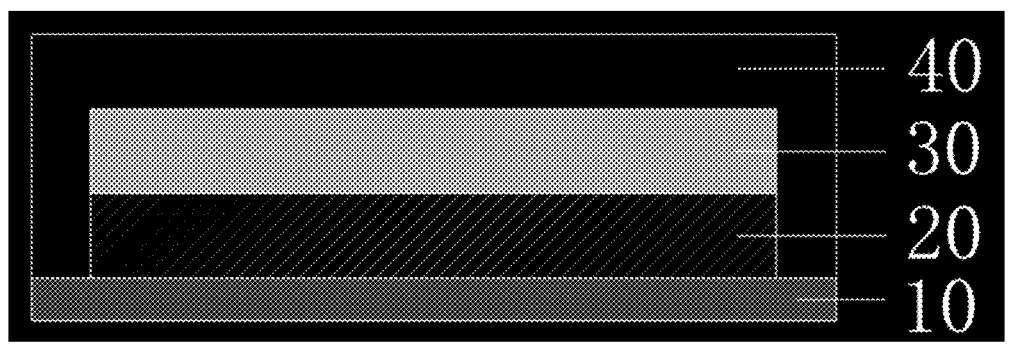
FIG. 7 is a diagram of Step S103 in a manufacturing method of a white light LED according to the embodiment of the present invention.

In Step S103, as shown in FIG. 7, an inorganic protective layer 40 is deposited on the light emitting layer 30 by vapor deposition to obtain a white light emitting diode. Optionally, the vapor deposition includes at least one of physical vapor deposition and chemical vapor deposition. Specifically, the deposition can be low temperature sputtering, PECVD or thermal evaporation but not limited thereto. The inorganic protective layer is deposited on the surface of the light emitting layer and covers the surfaces of the substrate on both sides of the light emitting layer. The inorganic protective layer and the substrate form an enclosed space for blocking the corrosion of the external water and oxygen. Optionally, a material of the inorganic protective layer 40 comprises at least one of SiO, $SiO_2$, AlN, SiAlN and $Al_2O_3$. Optionally, a thickness of the inorganic protective layer 40 is from 20 nm to 200 nm. The inorganic protective layer has a small thickness, which is conducive for heat dissipation and possesses a good effect of blocking water and oxygen, thereby increasing the options of the quantum dot materials. The additional replacement of the quantum dot material ligand is not required.

Compared with green phosphor powder β-SiAlON, which can be used to make white LEDs, the γ-AlON:$Mn^{2+}$, $Mg^{2+}$ green phosphor powder possesses properties of narrower half-width, higher color gamut and slower luminance decay. A more reliable white light emitting diode can be provided. Meanwhile, the color gamut of white light emitting diode made of γ-AlON:$Mn^{2+}$, $Mg^{2+}$ green phosphor powder can reach BT.2020 80% or more, which is equivalent to the use of green quantum dots. Since the quantum dot materials are expensive and are mostly composed of heavy metal-containing substances, the use of the γ-AlON:$Mn^{2+}$, $Mg^{2+}$ green phosphor powder reduces the use of quantum dot materials to reduce production costs and can be more environmental protective.

The manufacturing method of the white LED provided by the present invention has a simple manufacturing process. The operation process is mature and suitable for industrial production.

The above-described embodiment is merely the expression of several embodiments of the present invention, the description is more specific and detailed, but it cannot be construed as limiting the scope of the invention. It should be noted that any persons who are skilled in the art change or replacement which is easily derived should be covered by the protected scope of the invention. Thus, the protected scope of the invention should go by the subject claims. Accordingly, the scope of the present invention patent protection should prevail in the appended claims.

What is claimed is:

1. A white light emitting diode, comprising a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises γ-AlON:$Mn^{2+}$, $Mg^{2+}$ green phosphor powder.

2. The white light emitting diode according to claim 1, wherein the light emitting layer is a single layer structure, a molar ratio of the green phosphor powder, the red quantum dots and the disperse medium in the light emitting layer is (1.5-3):(0.001-0.02):1, and a thickness of the light emitting layer is from 50 μm to 400 μm.

3. The white light emitting diode according to claim 1, wherein the light emitting layer is a two layer structure, and the light emitting layer comprises a green phosphor powder layer and a red quantum dots layer, and a molar ratio of the green phosphor powder and the dispersion medium in the green phosphor powder layer is (1.5-3):1, and a molar ratio of the red quantum dots and the dispersion medium in the red quantum dots layer is (0.001-0.02):1.

4. The white light emitting diode according to claim 3, wherein a thickness of the green phosphor powder layer is from 50 μm to 200 μm, and a thickness of the red quantum dots layer is from 50 μm to 200 μm.

5. The white light emitting diode according to claim 1, wherein the green phosphor powder has a particle size of 15 μm to 35 μm, and the red quantum dot has a particle size of 5 nm to 10 nm, and the red quantum dots comprise at least one of CdSe/ZnS, CdSe/ZnSe, CdSe/CdS, InP/InPOx/ZnS, InP/ZnS, InP/ZnSe, $CH_3CN_2PbI_3$, $CsPbI_3$, CuInS, CuZnInS, $MoS_2$ quantum dots and graphene quantum dots.

6. The white light emitting diode according to claim 1, wherein the dispersion medium comprises at least one of organic silica gel, inorganic silica gel and epoxy resin.

7. The white light emitting diode according to claim 1, wherein the substrate comprises a ceramic substrate or a metal substrate, and a material of the ceramic substrate comprises at least one of AlN, $Al_2O_3$, SiO, $SiO_2$, $Si_3N_4$ and SiON, and a material of the metal substrate comprises at least one of potassium, sodium, calcium, magnesium and aluminum, and a thickness of the substrate is from 400 μm to 600 μm.

8. The white light emitting diode according to claim 1, wherein a material of the inorganic protective layer comprises at least one of SiO, $SiO_2$, AlN, SiAlN and $Al_2O_3$, and a thickness of the inorganic protective layer is from 20 nm to 200 nm.

9. A manufacturing method of a white light emitting diode, comprising steps of:
providing a substrate, and disposing a blue light die on the substrate with a die bonding process;
disposing a light emitting layer on the blue light die by a spin coating, dispensing or lamination process, wherein a material of the light emitting layer comprises green phosphor powder, red quantum dots and a disperse medium, and the green phosphor powder comprises γ-AlON:$Mn^{2+}$, $Mg^{2+}$ green phosphor powder;
depositing an inorganic protective layer on the light emitting layer by vapor deposition to obtain a white light emitting diode; wherein the white light emitting diode comprises a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises γ-AlON:$Mn^{2+}$, $Mg^{2+}$ green phosphor powder.

10. The manufacturing method of the white light emitting diode according to claim 9, wherein the light emitting layer is a single layer structure, a molar ratio of the green phosphor powder, the red quantum dots and the disperse medium in the light emitting layer is (1.5-3):(0.001-0.02):1, and a thickness of the light emitting layer is from 50 μm to 400 μm.

11. The manufacturing method of the white light emitting diode according to claim 9, wherein the light emitting layer is a two layer structure, and the light emitting layer comprises a green phosphor powder layer and a red quantum dots layer, and a molar ratio of the green phosphor powder and the dispersion medium in the green phosphor powder layer is (1.5-3):1, and a molar ratio of the red quantum dots and the dispersion medium in the red quantum dots layer is (0.001-0.02):1.

12. The manufacturing method of the white light emitting diode according to claim 11, wherein a thickness of the green phosphor powder layer is from 50 μm to 200 μm, and a thickness of the red quantum dots layer is from 50 μm to 200 μm.

13. The manufacturing method of the white light emitting diode according to claim 9, wherein the green phosphor powder has a particle size of 15 μm to 35 μm, and the red quantum dot has a particle size of 5 nm to 10 nm, and the red quantum dots comprise at least one of CdSe/ZnS, CdSe/ZnSe, CdSe/CdS, InP/InPOx/ZnS, InP/ZnS, InP/ZnSe, $CH_3CN_2PbI_3$, $CsPbI_3$, CuInS, CuZnInS, $MoS_2$ quantum dots and graphene quantum dots.

14. The manufacturing method of the white light emitting diode according to claim 9, wherein the dispersion medium comprises at least one of organic silica gel, inorganic silica gel and epoxy resin.

15. The manufacturing method of the white light emitting diode according to claim 9, wherein the substrate comprises a ceramic substrate or a metal substrate, and a material of the ceramic substrate comprises at least one of AlN, $Al_2O_3$, SiO, $SiO_2$, $Si_3N_4$ and SiON, and a material of the metal substrate comprises at least one of potassium, sodium, calcium, magnesium and aluminum, and a thickness of the substrate is from 400 μm to 600 μm.

16. The manufacturing method of the white light emitting diode according to claim 9, wherein a material of the inorganic protective layer comprises at least one of SiO, $SiO_2$, AlN, SiAlN and $Al_2O_3$, and a thickness of the inorganic protective layer is from 20 nm to 200 nm.

17. A backlight module, comprising a white light emitting diode, wherein the white light emitting diode comprises a substrate, and a blue chip, a light emitting layer and an inorganic protective layer, which are sequentially disposed on the substrate, wherein a material of the light emitting layer comprises green phosphor powder, red quantum dots and a disperse medium, and the green phosphor powder comprises γ-AlON:$Mn^{2+}$, $Mg^{2+}$ green phosphor powder.

18. The backlight module according to claim 17, wherein the light emitting layer is a single layer structure, a molar ratio of the green phosphor powder, the red quantum dots and the disperse medium in the light emitting layer is (1.5-3):(0.001-0.02):1, and a thickness of the light emitting layer is from 50 μm to 400 μm.

19. The backlight module according to claim 17, wherein the light emitting layer is a two layer structure, and the light emitting layer comprises a green phosphor powder layer and a red quantum dots layer, and a molar ratio of the green phosphor powder and the dispersion medium in the green phosphor powder layer is (1.5-3):1, and a molar ratio of the red quantum dots and the dispersion medium in the red quantum dots layer is (0.001-0.02):1.

20. The backlight module according to claim 17, wherein the green phosphor powder has a particle size of 15 μm to 35 μm, and the red quantum dot has a particle size of 5 nm to 10 nm, and the red quantum dots comprise at least one of CdSe/ZnS, CdSe/ZnSe, CdSe/CdS, InP/InPOx/ZnS, InP/ZnS, InP/ZnSe, $CH_3CN_2PbI_3$, $CsPbI_3$, CuInS, CuZnInS, $MoS_2$ quantum dots and graphene quantum dots.

* * * * *